United States Patent [19]

Nishikawa

[11] 4,449,067
[45] May 15, 1984

[54] LOW POWER, PROCESS AND TEMPERATURE INSENSITIVE FET BIAS CIRCUIT

[75] Inventor: Yukio Nishikawa, Los Gatos

[73] Assignee: Precision Monolithics, Inc., Santa Clara, Calif.

[21] Appl. No.: 290,432

[22] Filed: Aug. 6, 1981

[51] Int. Cl.³ .................... H03K 17/14; H03K 17/687
[52] U.S. Cl. .................................. 307/570; 307/580; 307/571
[58] Field of Search ............................... 307/570–572, 307/239, 310, 573, 574, 580, 362

[56] References Cited

U.S. PATENT DOCUMENTS 3,955,103  5/1976  Russell et al. ..................... 307/573
4,228,367  10/1980  Brown ................................ 307/572
4,323,796  4/1982  Lathrope ........................ 307/572 X

OTHER PUBLICATIONS

Adib R. Hamade and Jose F. Albarran, "A JFET/Bipolar 8-Channel Analog Multiplexer," *I.E.E.E. Journal of Solid State Circuits*, Dec. 1975, pp. 399–406.

Data Sheet for SSS7510/7511 Quad SPST BI-FET Analog Switch.

*Primary Examiner*—Larry N. Anagnos
*Assistant Examiner*—David R. Bertelson
*Attorney, Agent, or Firm*—Koppel & Harris

[57] ABSTRACT

A bias circuit for an FET switch in which a pinch-off voltage is generated and sets up a current through a first resistor. The current is reflected through a second resistor to establish a voltage differential across the second resistor which is then imposed across the gate-source terminals of the switch FET when it is desired to turn the switch OFF. The relationship of the turn-off voltage imposed across the switch FET to its pinch-off voltage is determined by the ratio of the resistance values of the two matched resistors, which ratio is independent process and temperature. The switch bias circuit thus offers highly reliable operation and at the same time a greatly reduced power consumption.

10 Claims, 2 Drawing Figures

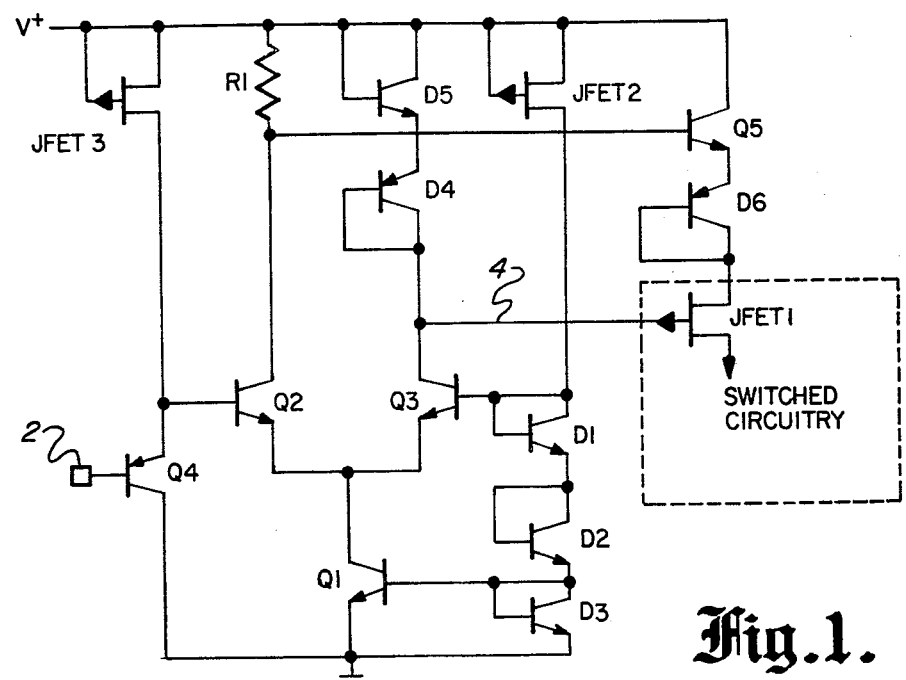
Fig.1.
(PRIOR ART)
Fig.2.
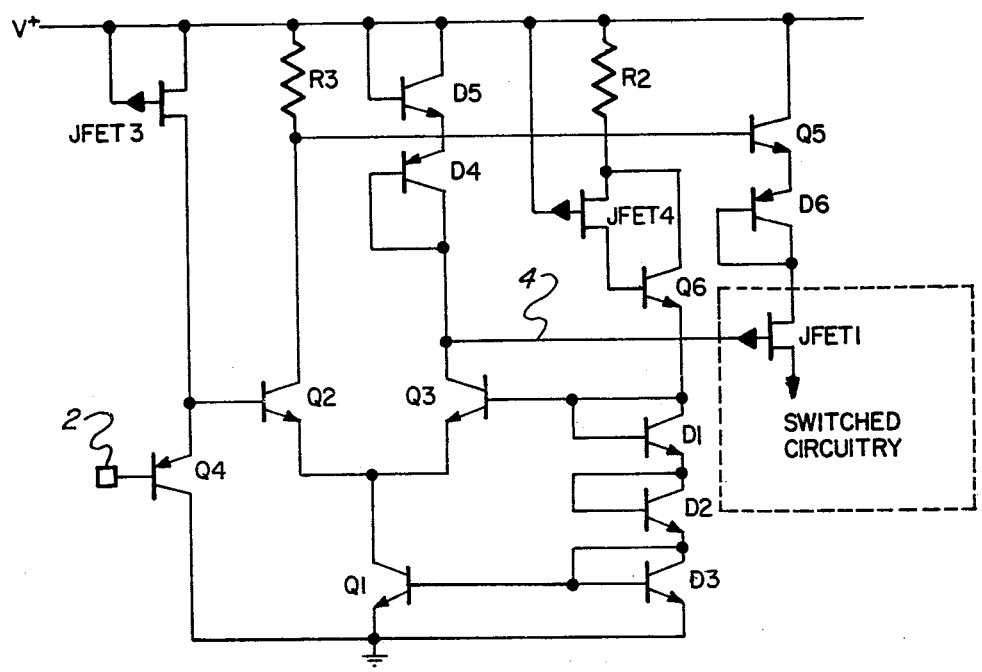

$V_p$ of both elements will vary in the same manner. The relationship between $V_p$ and the OFF voltage applied across the gate-source terminals of JFET1 is thus dependent only on the R3/R2 ratio, which is substantially independent of both processing and temperature variations. A considerably greater resistance value can thus be assigned to R3 than was possible with the prior art circuit of FIG. 1, resulting in a correspondingly reduced power consumption by that element, without jeopardizing the proper switching of JFET1.

While a particular embodiment of the invention has been shown and described, numerous variations may occur to those skilled in the art. For example, any circuit other than JFET4/Q6 capable of generating a $V_p$ matched with that of JFET1 could be used. As another example, the current steered through the differential switch and R3 could differ in magnitude from the current through R2, so long as the resistance value of R3 is adjusted so that it establishes the correct voltage to be applied to JFET1. Accordingly, it is intended that the invention be limited only in terms of the appended claims.

I claim:

1. A lower power, process and temperature insensitive circuit for a switch FET, said switch FET having a gate, source and drain and characterized by a pinch-off voltage which is subject to processing and temperature variations, comprising:
    a bus for receiving a voltage potential from a voltage source,
    first and second resistors having a predetermined resistance ratio and each connected to the bus,
    first circuit means connected with respect to the bus to generate a voltage across the first resistor which is proportional to the switch FET pinch-off voltage, and thereby drive a current proportional to the pinch-off voltage through the first resistor,
    current reflection means connected to receive current from the first resistor and to drive a current through the second resistor which is proportional to the current through the first resistor, and thereby generate a voltage across the second resistor which is proportional to the pinch-off voltage,
    switch control means controlling the application of current to the second resistor, and
    second circuit means connecting the bus and one end of the second resistor in circuit with the switch FET gate, and the other end of the second resistor with the switch FET source to impose a voltage across the gate-source terminals of the switch FET which is controlled by the current through the second resistor and is at least equal to the pinch-off voltage when said proportional currents flow through the first and second resistors.

2. The circuit of claim 1, said first circuit means comprising a control FET matched with the switch FET, and circuitry for establishing a pinch-off voltage across the control FET, said control FET having its gate connected in common with one end of the first resistor and with the bus, its source connected to the opposite end of the first resistor, and its source and drain connected to the circuitry for establishing a pinch-off voltage across the control FET.

3. The circuit of claims 1 or 2, wherein the current reflection means controls the current driven through the second resistor in response to the current through the first resistor to produce a voltage drop across the second resistor which is slightly greater than the pinch-off voltage, and said second circuit means imposes a gate-source voltage across the switch FET which is substantially equal to the voltage across the second resistor.

4. The circuit of claims 1 or 2, wherein said current reflection means includes a current mirror means connected to mirror the current through the first resistor and to drive a substantially equal current through the second resistor.

5. The circuit of claim 3, wherein the resistance of the second resistor is slightly greater than that of the first resistor, thereby producing voltages across the second resistor and switch FET which are slightly greater than the pinch-off voltage.

6. A low power, process and temperature insensitive bias circuit for a switch FET, said switch characterized by a pinch-off voltage which is subject to processing and temperature variations, comprising:
    a source of electric potential,
    a control FET matched with the switch FET,
    means connected with respect to the potential source for generating a pinch-off voltage across the gate and source of the control FET,
    circuit means interconnecting the switch and control FETs to establish a voltage across the gate-source terminals of the switch FET which is at least as great as the voltage across the gate-source terminals of the control FET, said circuit means including means for sensing the current through the control FET and connected with respect to the potential source to impose a voltage across the gate-source terminals of the switch FET which is proportional to the sensed voltage, an interrupt switch for disconnecting the interconnection between the switch and control FETs, and first and second matched resistors, the first resistor being connected across the gate and source terminals of the control FET, whereby the current through the first resistor is proportional to the gate-source voltage of the control FET, the second resistor being connected in a circuit with the gate and source terminals of the switch FET such that the voltage across the second resistor is substantially equal to the voltage across the gate-source terminals of the switch FET, further circuit means driving a current through the second resistor in proportion to the current through the first resistor, and switch control means connected to actuate the interrupt switch and thereby disconnect the interconnection between the control FET and switch FET in response to a switch actuation command.

7. The circuit of claim 6, wherein the resistance values of the first and second resistors are proportionately matched to establish a gate-source voltage across the switch FET slightly greater than the pinch-off voltage.

8. A low power, process and temperature insensitive bias circuit for a switch FET, said switch characterized by a pinch-off voltage which is subject to processing and temperature variations, comprising:
    a bus for receiving a voltage potential from a voltage source,
    a control FET matched with the switch FET and having its gate connected to the voltage bus,
    a first resistor connected between the source of the control FET and the voltage bus,
    a bipolar transistor having its base and one of its collector-emitter terminals connected across the source-drain terminals of the control FET to establish a pinch-off voltage across the control FET and the first resistor, and its other collector-emitter terminal providing a current output substantially equal to the current through the first resistor, a differential switch having first and second branches, a current source for said differential switch connected to mirror the current flowing through the first resistor, switch control means connected to steer current from said current source to one or the other of the differential switch branches in response to the presence or absence of an input switch control signal, a second resistor connected to the voltage bias line in one branch of the differential switch to receive the differential switch current in response to an OFF signal from the switch control means, said second resistor being matched with the first resistor to generate a voltage at least equal to the voltage across the first resistor in response to received differential switch current, and circuit means including the other branch of the differential switch and connecting the second resistor and voltage bus in circuit with the switch FET to impose a voltage across the gate-source terminals of the switch FET at least equal to the voltage across the second resistor, whereby a voltage at least equal to the pinch-off voltage is imposed across the gate-source terminals of the switch FET in response to an OFF signal from the switch control means.

9. The circuit of claim 8, wherein the resistance of the second resistor is slightly larger than the resistance of the first resistor, thereby establishing a voltage slightly greater than the pinch-off voltage across the gate-source terminals of the switch FET in response to an OFF signal from the switch control means.

10. The circuits of claims 1, 2, 6 or 8, said control and switch FETs each comprising junction FETs.

* * * * *